(12) United States Patent
Miki et al.

(10) Patent No.: US 10,848,695 B2
(45) Date of Patent: Nov. 24, 2020

(54) SOLID STATE IMAGING DEVICE, IMAGING SYSTEM, AND MANUFACTURING METHOD OF SOLID STATE IMAGING DEVICE

(71) Applicant: CANON KABUSHIKI KAISHA, Tokyo (JP)

(72) Inventors: Takafumi Miki, Yokohama (JP); Masahiro Kobayashi, Tokyo (JP); Yusuke Onuki, Fujisawa (JP); Hiroshi Sekine, Kawagoe (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 163 days.

(21) Appl. No.: 15/872,208

(22) Filed: Jan. 16, 2018

(65) Prior Publication Data
US 2018/0213167 A1 Jul. 26, 2018

(30) Foreign Application Priority Data
Jan. 26, 2017 (JP) .................................. 2017-011970

(51) Int. Cl.
*H04N 5/359* (2011.01)
*H01L 27/146* (2006.01)
(Continued)

(52) U.S. Cl.
CPC ....... *H04N 5/3597* (2013.01); *H01L 27/1461* (2013.01); *H01L 27/14614* (2013.01);
(Continued)

(58) Field of Classification Search
CPC .............. H04N 5/3597; H04N 5/3742; H04N 5/37452; H01L 27/14614; H01L 27/1461;
(Continued)

(56) References Cited

U.S. PATENT DOCUMENTS

| 7,462,810 B2 | 12/2008 | Kobayashi et al. |
| 7,928,477 B2 | 4/2011 | Kobayashi et al. |

(Continued)

FOREIGN PATENT DOCUMENTS

| WO | 2011/043432 A | 4/2011 | |
| WO | WO-2016136486 A1 * | 9/2016 | ......... H04N 5/35581 |

OTHER PUBLICATIONS

U.S. Appl. No. 15/791,909, filed Oct. 24, 2017. Applicant: Hiroshi Sekine, et al.
(Continued)

*Primary Examiner* — Richard A Hansell, Jr.
(74) *Attorney, Agent, or Firm* — Venable LLP

(57) ABSTRACT

A solid state imaging device as an embodiment has a first transfer unit that includes a first gate and transfers charges from a photoelectric conversion portion to a holding portion; a second transfer unit that includes a second gate and transfers charges from the holding portion to a floating diffusion portion; and a third transfer unit that includes a third gate and drains charges from the photoelectric conversion portion to the charge draining portion. The impurity concentration of a second conductivity type in at least a part of a region under the first gate of the first transfer unit is lower than the impurity concentration of the second conductivity type in a region under the second gate of the second transfer unit and the impurity concentration of the second conductivity type in a region under the third gate of the third transfer unit.

11 Claims, 11 Drawing Sheets

(51) Int. Cl.
*H04N 5/374* (2011.01)
*H04N 5/3745* (2011.01)
*G01C 3/00* (2006.01)

(52) U.S. Cl.
CPC .. *H01L 27/14623* (2013.01); *H01L 27/14636* (2013.01); *H01L 27/14656* (2013.01); *H01L 27/14685* (2013.01); *H01L 27/14689* (2013.01); *H04N 5/3742* (2013.01); *H04N 5/37452* (2013.01); *G01C 3/00* (2013.01)

(58) Field of Classification Search
CPC ......... H01L 27/14623; H01L 27/14656; H01L 27/14685; H01L 27/14689; H01L 27/14636; G01C 3/00
See application file for complete search history.

(56) References Cited

U.S. PATENT DOCUMENTS

| | | | |
|---|---|---|---|
| 7,935,995 B2 | 5/2011 | Watanabe et al. | |
| 7,999,871 B2* | 8/2011 | Hagihara | H04N 5/3597 348/308 |
| 8,045,034 B2 | 10/2011 | Shibata et al. | |
| 8,063,351 B2 | 11/2011 | Kobayashi et al. | |
| 8,115,848 B2 | 2/2012 | Onuki et al. | |
| 8,174,604 B2 | 5/2012 | Shibata et al. | |
| 8,222,682 B2 | 7/2012 | Watanabe et al. | |
| 8,259,206 B1 | 9/2012 | Shibata et al. | |
| 8,289,432 B2 | 10/2012 | Shibata et al. | |
| 8,357,956 B2 | 1/2013 | Kobayashi et al. | |
| 8,427,564 B2 | 4/2013 | Yamashita et al. | |
| 8,456,559 B2 | 6/2013 | Yamashita et al. | |
| 8,552,353 B2* | 10/2013 | Kobayashi | H01L 27/14612 250/208.1 |
| 8,558,293 B2 | 10/2013 | Kawahito et al. | |
| 8,723,232 B2 | 5/2014 | Kobayashi et al. | |
| 8,736,734 B2 | 5/2014 | Onuki et al. | |
| 8,884,391 B2 | 11/2014 | Fudaba et al. | |
| 8,884,864 B2* | 11/2014 | Sakuragi | H04N 5/3658 345/100 |
| 9,147,708 B2 | 9/2015 | Okita et al. | |
| 9,153,610 B2 | 10/2015 | Kobayashi et al. | |
| 9,276,027 B2 | 3/2016 | Okita et al. | |
| 9,344,653 B2 | 5/2016 | Shimotsusa et al. | |
| 9,419,038 B2 | 8/2016 | Kobayashi et al. | |
| 9,445,026 B2 | 9/2016 | Kobayashi et al. | |
| 9,538,112 B2 | 1/2017 | Wada et al. | |
| 9,548,328 B2 | 1/2017 | Hasegawa et al. | |
| 9,716,849 B2 | 7/2017 | Kobayashi et al. | |
| 9,768,213 B2 | 9/2017 | Soda et al. | |
| 9,818,794 B2 | 11/2017 | Okita et al. | |
| 9,876,975 B2 | 1/2018 | Yoshida et al. | |
| 9,894,295 B2 | 2/2018 | Kawabata et al. | |
| 2004/0130757 A1* | 7/2004 | Mabuchi | H04N 5/359 358/482 |
| 2006/0065896 A1* | 3/2006 | Abe | H01L 27/14643 257/69 |
| 2006/0226438 A1* | 10/2006 | Katsuno | H01L 27/1463 257/113 |
| 2008/0258190 A1* | 10/2008 | Shinohara | H01L 27/14609 257/292 |
| 2009/0256176 A1* | 10/2009 | Kobayashi | H04N 5/37452 257/225 |
| 2012/0193745 A1* | 8/2012 | Onuki | H01L 27/14609 257/461 |
| 2013/0135448 A1* | 5/2013 | Nagumo | H04N 13/204 348/49 |
| 2013/0206965 A1 | 8/2013 | Yamashita et al. | |
| 2014/0061436 A1 | 3/2014 | Kobayashi | |
| 2014/0103412 A1* | 4/2014 | Lee | H01L 27/1463 257/292 |
| 2016/0020237 A1* | 1/2016 | Yamakawa | H01L 27/14603 257/233 |
| 2016/0100113 A1* | 4/2016 | Oh | H04N 5/3592 348/296 |
| 2016/0227139 A1 | 8/2016 | Shimotsusa et al. | |
| 2016/0322406 A1 | 11/2016 | Kobayashi et al. | |
| 2017/0078557 A1 | 3/2017 | Kawabata et al. | |
| 2017/0078604 A1 | 3/2017 | Kobayashi et al. | |
| 2017/0257590 A1* | 9/2017 | Kato | G01S 1/00 |
| 2017/0289478 A1 | 10/2017 | Kobayashi et al. | |
| 2017/0294470 A1 | 10/2017 | Takami et al. | |
| 2017/0301719 A1* | 10/2017 | Iwata | H01L 27/14645 |
| 2017/0359535 A1 | 12/2017 | Kobayashi et al. | |
| 2017/0359538 A1 | 12/2017 | Kobayashi et al. | |
| 2017/0359539 A1 | 12/2017 | Kawabata et al. | |
| 2018/0026073 A1 | 1/2018 | Tsuboi et al. | |
| 2018/0138226 A1* | 5/2018 | Peizerat | H04N 5/363 |

OTHER PUBLICATIONS

U.S. Appl. No. 15/834,293, filed Dec. 7, 2017. Applicant: Daisuke Yoshida, et al.

U.S. Appl. No. 15/872,190, filed Jan. 16, 2018. Applicant: Yusuke Onuki.

* cited by examiner

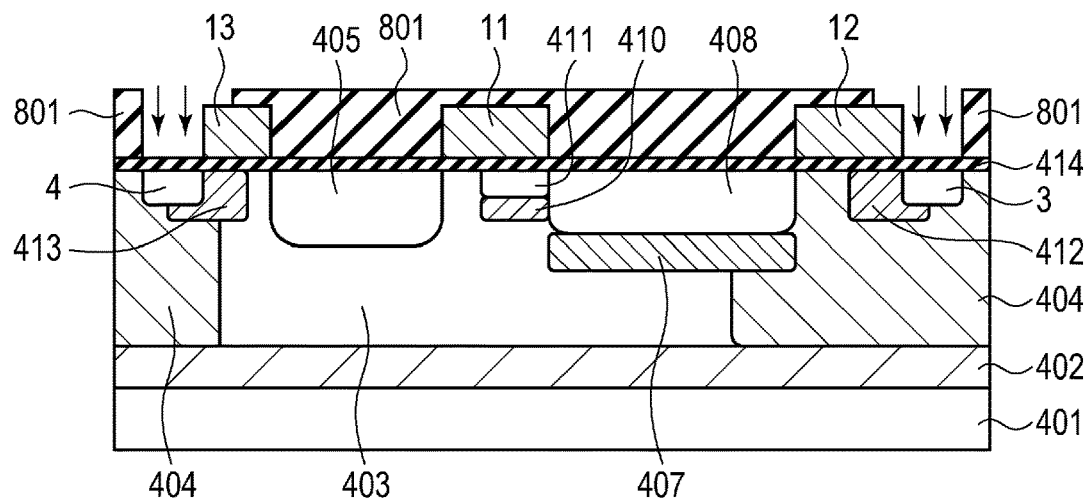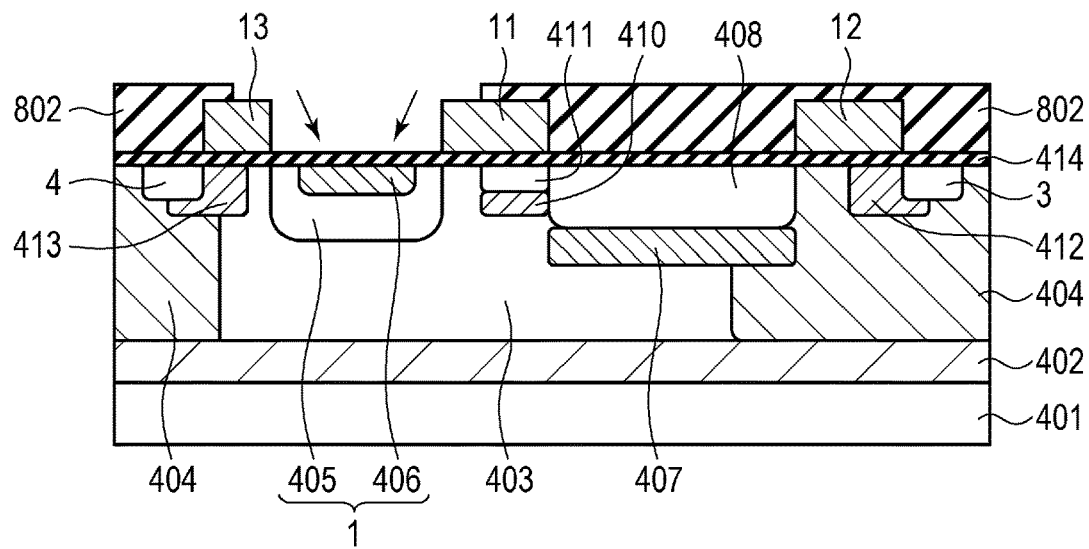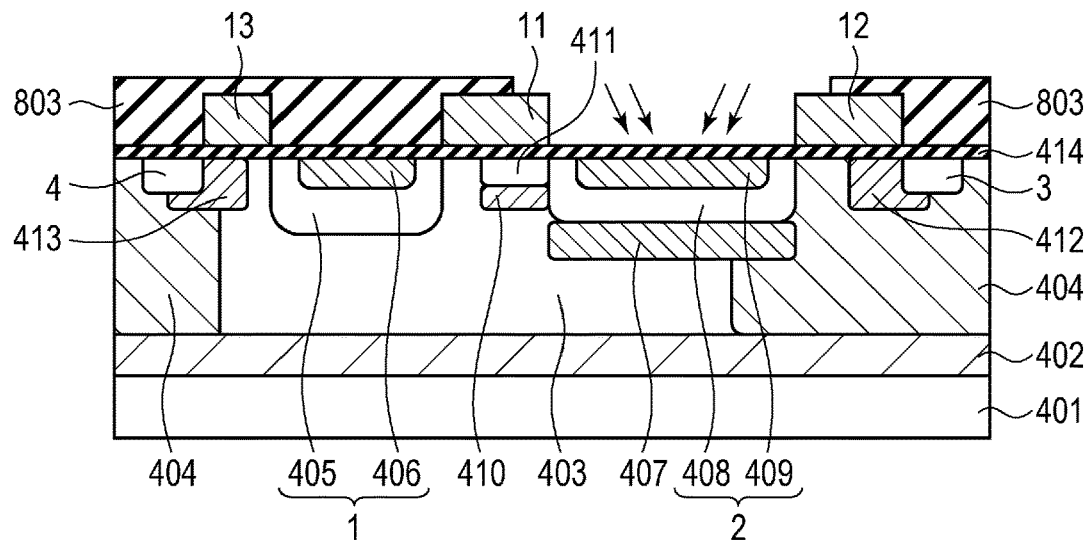

SOLID STATE IMAGING DEVICE, IMAGING SYSTEM, AND MANUFACTURING METHOD OF SOLID STATE IMAGING DEVICE

BACKGROUND OF THE INVENTION

Field of the Invention

The present invention relates, in particular, to a solid state imaging device having a global shutter function, an imaging system, and a manufacturing method of the solid state imaging device.

Description of the Related Art

In recent years, CMOS image sensors that have low power consumption and are suitable for fast readout operation are widely used in imaging devices such as a digital still camera, a digital video camera, or the like. In a CMOS image sensor, a global (all-pixel simultaneous) shutter function has been proposed (International Publication No. WO2011/043432) in addition to a row-sequential readout operation. For example, the global shutter may be realized by using first transfer gates that transfer charges from photoelectric conversion portions to holding portions simultaneously in all the pixels and second transfer gates that sequentially read out the charges in the holding portions.

In International Publication No. WO2011/043432, a channel under the first transfer gate that performs a global shutter operation has the structure in which the potential on the holding portion side is lower than the potential of the photoelectric conversion portion side. By applying a voltage to the first transfer gate while maintaining such a potential difference, it provides for realizing full transfer of charges and ensure sufficient accumulation charges.

In International Publication No. WO2011/043432, however, the potential barrier on the holding portion side is lower than the potential barrier on the photoelectric conversion portion side in the transfer channel when the first transfer gate is in an off-state. Thus, sufficient potential barrier cannot be formed in an off-state even with the entire transfer gate, and carriers are likely to leak. As a result, when charge accumulation portion is saturated with carriers, for example, overflowed carriers may leak into the holding portion. Since this causes carriers which do not contribute to a correct signal to flow into the holding portion, the image quality may deteriorate, and a problem such as mixture of images among a plurality of frames of a motion image may occur, for example.

Similarly, when the second transfer gate that performs a readout operation is in an off-state, the potential barrier of the second transfer gate is higher than the potential barrier in an off-state of the first transfer gate. As a result, when the holding portion is saturated with carriers, for example, this may cause a reverse flow of overflowed carriers to the charge accumulation portion. Also in this case, for example, a problem such as mixture of images among a plurality of frames of a motion image may occur.

The object of the present invention is to obtain a good image quality in a solid state imaging device having a global shutter function.

SUMMARY OF THE INVENTION

A solid state imaging device according to one embodiment of the present invention includes: a photoelectric conversion portion of a first conductivity type; a holding portion of the first conductivity type; a floating diffusion portion of the first conductivity type; a charge draining portion; a first transfer unit that includes a first gate and transfers charges from the photoelectric conversion portion to the holding portion; a second transfer unit that includes a second gate and transfers charges from the holding portion to the floating diffusion portion; and a third transfer unit that includes a third gate and drains charges from the photoelectric conversion portion to the charge draining portion. The impurity concentration of a second conductivity type in at least a part of a region under the first gate of the first transfer unit is lower than the impurity concentration of the second conductivity type in a region under the second gate of the second transfer unit and the impurity concentration of the second conductivity type in a region under the third gate of the third transfer unit.

A manufacturing method of a solid state imaging device according to another embodiment of the present invention includes: forming a photoelectric conversion portion, a holding portion, and a floating diffusion portion, each of which is a first conductivity type, over a semiconductor substrate; forming a charge draining portion over the semiconductor substrate; forming a first transfer unit that transfers charges from the photoelectric conversion portion to the holding portion; forming a second transfer unit that transfers charges from the holding portion to the floating diffusion portion; forming a third transfer unit that drains charges from the photoelectric conversion portion to the charge draining portion; forming a charge barrier region of a second conductivity type for forming respective potential barriers in a region where the first transfer unit is formed and a region where the third transfer unit is formed; and forming a transfer assist region of the first conductivity type in at least a part of the region where the first transfer unit is formed by using a mask that covers the region where the third transfer unit is formed and exposes the region where the first transfer unit is formed.

Further features of the present invention will become apparent from the following description of exemplary embodiments with reference to the attached drawings.

BRIEF DESCRIPTION OF THE DRAWINGS

FIG. 8A, FIG. 8B, and FIG. 8C are diagrams illustrating the manufacturing method of the solid state imaging device according to the first embodiment.

DESCRIPTION OF THE EMBODIMENTS

Preferred embodiments of the present invention will now be described in detail in accordance with the accompanying drawings.

First Embodiment

Figure 1:
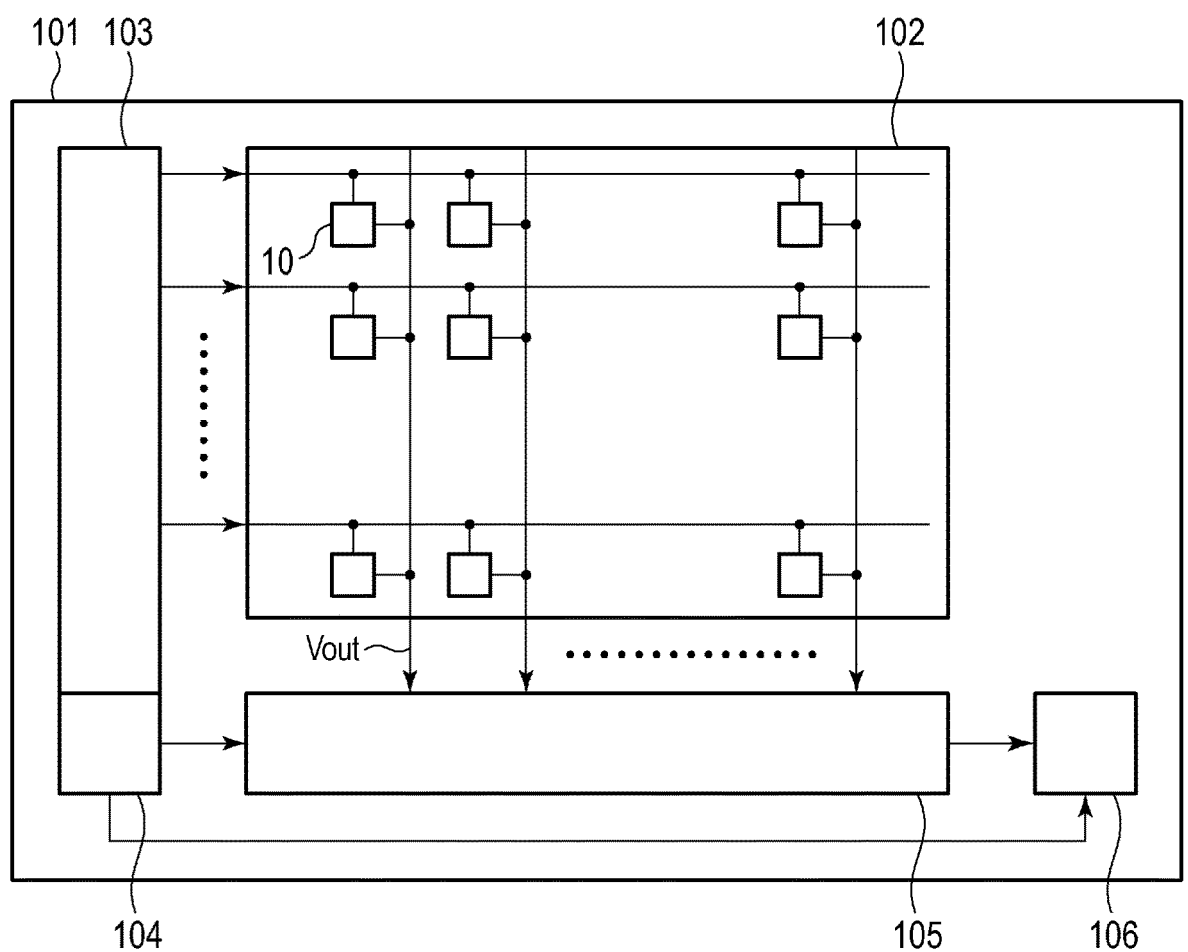
FIG. 1 is a schematic block diagram of a solid state imaging device according to a first embodiment.

FIG. 1 is a schematic block diagram of a solid state imaging device according to the present invention. A solid state imaging device 101 is a CMOS image sensor and includes an image pickup region 102, a vertical scanning circuit 103, a power source supply unit 104, a horizontal scanning circuit 105, and an output unit 106. The image pickup region 102 has a plurality of pixels 10 arranged in a matrix, and each of the pixels 10 includes a photoelectric conversion portion that generates and accumulates charges based on an irradiation light. Note that, in the present specification, the row direction represents the horizontal direction in the drawings, and the column direction represents the vertical direction in the drawings. Micro lenses and color filters may be arranged over the pixels 10. The color filters are primary color filters of red, blue, and green, for example, and arranged over respective pixels 10 according to the Bayer array. Some of the pixels 10 are shielded from light as optical black pixels (OB pixel). In the plurality of pixels 10, provided are a ranging row on which focus detection pixels that output pixel signals used for focus detection are arranged and a plurality of image pickup rows on which image pickup pixels that output pixel signals used for generating an image are arranged. The plurality of pixels 10 included in one column are connected on one column signal line Vout.

The vertical scanning circuit 103 is formed of a shift resistor, a gate circuit, a buffer circuit, and the like and outputs drive pulses on a row basis based on a vertical synchronization signal, a horizontal synchronization signal, a clock signal, and the like. The power source supply unit 104 includes a constant voltage circuit that generates a plurality of different voltages and provides a drive power source to each unit of the solid state imaging device 101. In the present embodiment, the power source supply unit 104 can generate optimized voltages respectively for the plurality of drive pulses supplied to the pixels 10. The horizontal scanning circuit 105 includes column amplifier circuits and shift resistors. The column amplifier circuit includes a differential amplifier circuit and a holding circuit and amplifies and temporarily holds a pixel signal output to the column signal line Vout from the pixel 10. The shift resistor sequentially reads out pixel signals held in the column amplifier circuits. The output unit 106 has a differential amplifier circuit, a buffer circuit, and a cramp circuit and outputs a pixel signal read out from the horizontal scanning circuit 105 to the outside of the solid state imaging device 101. Such a configuration can cause a light irradiated on the image pickup region 102 via an optical system to be output as a two-dimensional image signal that is an electrical signal. Note that an analog-to-digital converter circuit may be provided in the output unit 106 to output a digital image signal.

Figure 2:
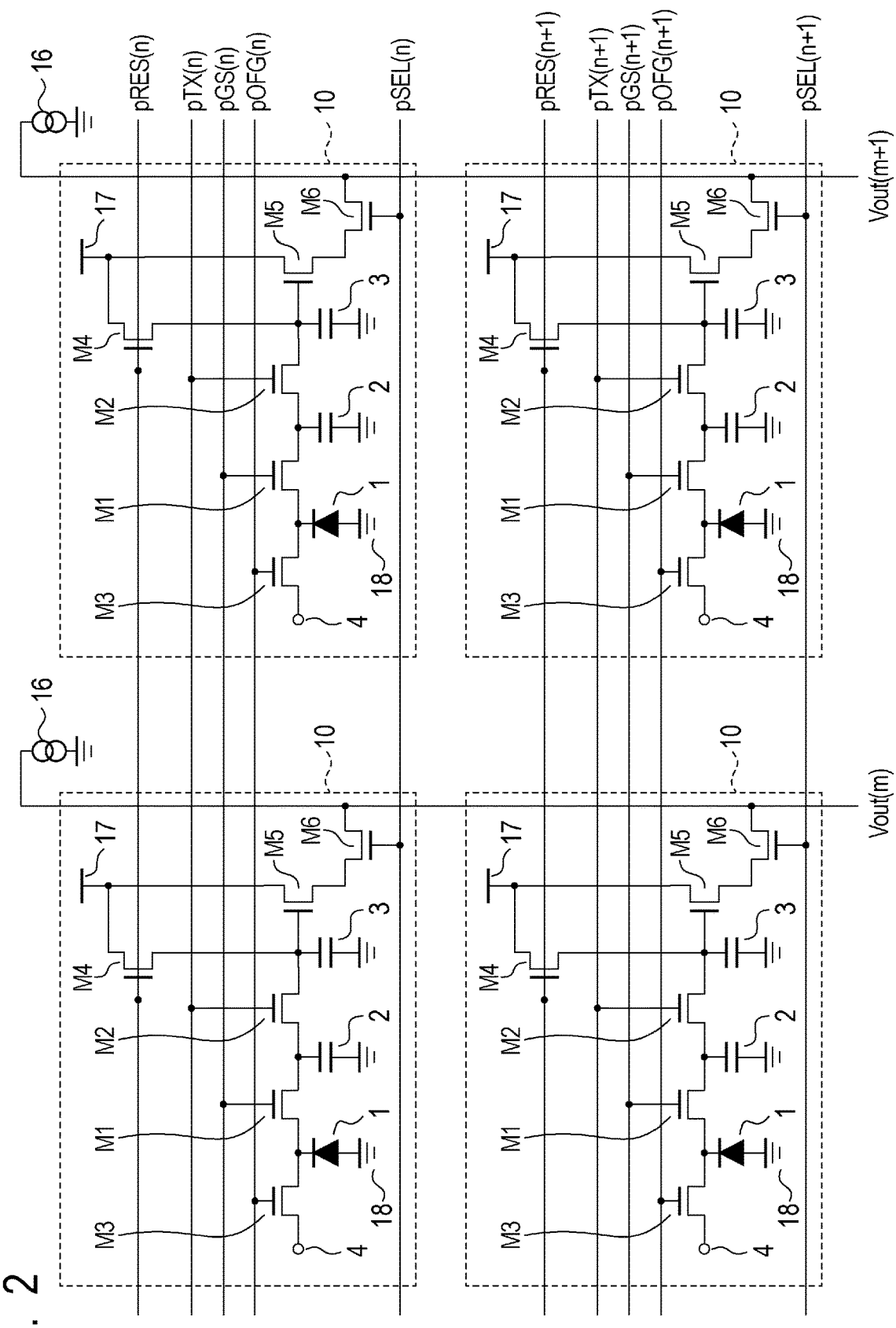
FIG. 2 is a circuit diagram of pixels of the first embodiment.

FIG. 2 is a circuit diagram of the pixels 10 in the present embodiment. Although four pixels 10 on the n-th row, the (n+1)-th row, the m-th row, and the (m+1)-th row are illustrated in FIG. 2 for simplified illustration, the number of pixels 10 is not limited thereto. Each of the pixels 10 includes a photoelectric conversion portion 1, a holding portion 2, a floating diffusion portion 3, and a charge draining portion (overflow drain) 4. The pixel 10 further includes a first transfer transistor (first transfer unit) M1, a second transfer transistor (second transfer unit) M2, a third transfer transistor (third transfer unit) M3, a reset transistor M4, an amplification transistor M5, and a selection transistor M6. While these transistors M1 to M6 may be N-type MOS transistors or may be P-type MOS transistors, an example with N-type MOS transistors will be described below. The drive pulses pRES, pTX, pOFG, pGS, and pSEL are output from the vertical scanning circuit 103 to signal lines for the pixels 10 on each row. When the transistors M1 to M6 are formed of P-type MOS transistors, the logic level of the drive pulses will be opposite to that described below.

In response to receiving a light entering the pixel 10, the photoelectric conversion portion 1 generates charges in accordance with the light amount and accumulates the generated charges. In the photoelectric conversion portion 1, the anode is connected to the ground 18, and the cathode is connected to the first transfer transistor M1 and the third transfer transistor M3. The first transfer transistor M1 is provided between the photoelectric conversion portion 1 and the holding portion 2 and applied with the drive pulse pGS. When the drive pulse pGS becomes a high level and the first transfer transistor M1 is turned on, the charges accumulated in the photoelectric conversion portion 1 are transferred to the holding portion 2. The holding portion 2 accumulates and holds the charges transferred from the photoelectric conversion portion 1. The second transfer transistor M2 is provided between the holding portion 2 and the floating diffusion portion 3 and applied with the drive pulse pTX. When the drive pulse pTX becomes a high level and the second transfer transistor M2 is turned on, charges are transferred from the holding portion 2 to the floating diffusion portion 3. The floating diffusion portion 3 functions as a charge-to-voltage conversion unit that temporarily holds charges transferred from the holding portion 2 and converts the held charges into a voltage signal.

The third transfer transistor M3 is provided between the photoelectric conversion portion 1 and the charge draining portion 4 and applied with the drive pulse pOFG. When the drive pulse pOFG becomes a high level and the third transfer transistor M3 is turned on, the charges generated in the photoelectric conversion portion 1 are transferred to the charge draining portion 4. Note that the charge draining portion 4 may be connected to a power source 17.

The reset transistor M4 is provided between the floating diffusion portion 3 and the power source 17 and applied with the drive pulse pRES. When the drive pulse pRES becomes a high level and the reset transistor M4 is turned on, the potential of the floating diffusion portion is reset to the power source voltage. Note that, by turning on the second transfer transistor M2 at the same time, it is also possible to reset the holding portion 2. Furthermore, by turning on the first transfer transistor M1 and the second transfer transistor M2 at the same time, it is possible to reset both the photoelectric conversion portion 1 and the holding portion 2. The amplification transistor M5 operates as a source follower and outputs a pixel signal in accordance with the voltage of the floating diffusion portion 3. The selection transistor M6 is provided between the amplification transistor M5 and the column signal line Vout, and the drive pulse pSEL is applied to the transfer gate. When the drive pulse pSEL becomes a high level, the selection transistor M6 is turned on, and the pixel signal amplified by the amplification transistor M5 is output to the column signal line Vout. A current source 16 that is a load of the amplification transistor M5 is connected to the column signal line Vout.

In a global shutter operation, the pixels 10 are driven such that photoelectric conversion periods, that is, periods from the start of exposure to the end of exposure of all the pixels 10 are matched. For example, by switching the first transfer transistors M1, the second transistors M2, and the reset transistors M4 from an on-state to an off-state at the same time, the photoelectric conversion portions start exposure at the same time in all the pixels 10. Alternatively, exposure on the photoelectric conversion portions 1 may be started by switching the third transfer transistors M3 from an on-state to an off-state at the same time in all the pixels 10. The timing of the end of exposure can be matched by switching the first transfer transistors M1 from an off-state to an on-state at the same time in all the pixels 10. In such a way, by matching exposure periods of the photoelectric conversion portion 1 in all the pixels 10, the global shutter can be realized. Then, in readout periods of respective frames, the second transfer transistors M2 are turned on, on a row basis, and thereby charges of the previous frame are transferred sequentially from the holding portions 2 to the amplification transistors M5. Note that the number of signals to be output in a readout period may be changed in accordance with the format of an image to be output. For example, when a motion image is captured, signals corresponding to the number of horizontal lines used in one frame may be output. Note that signals may not be output from all the pixels 10 of the solid state imaging device.

Figure 3:
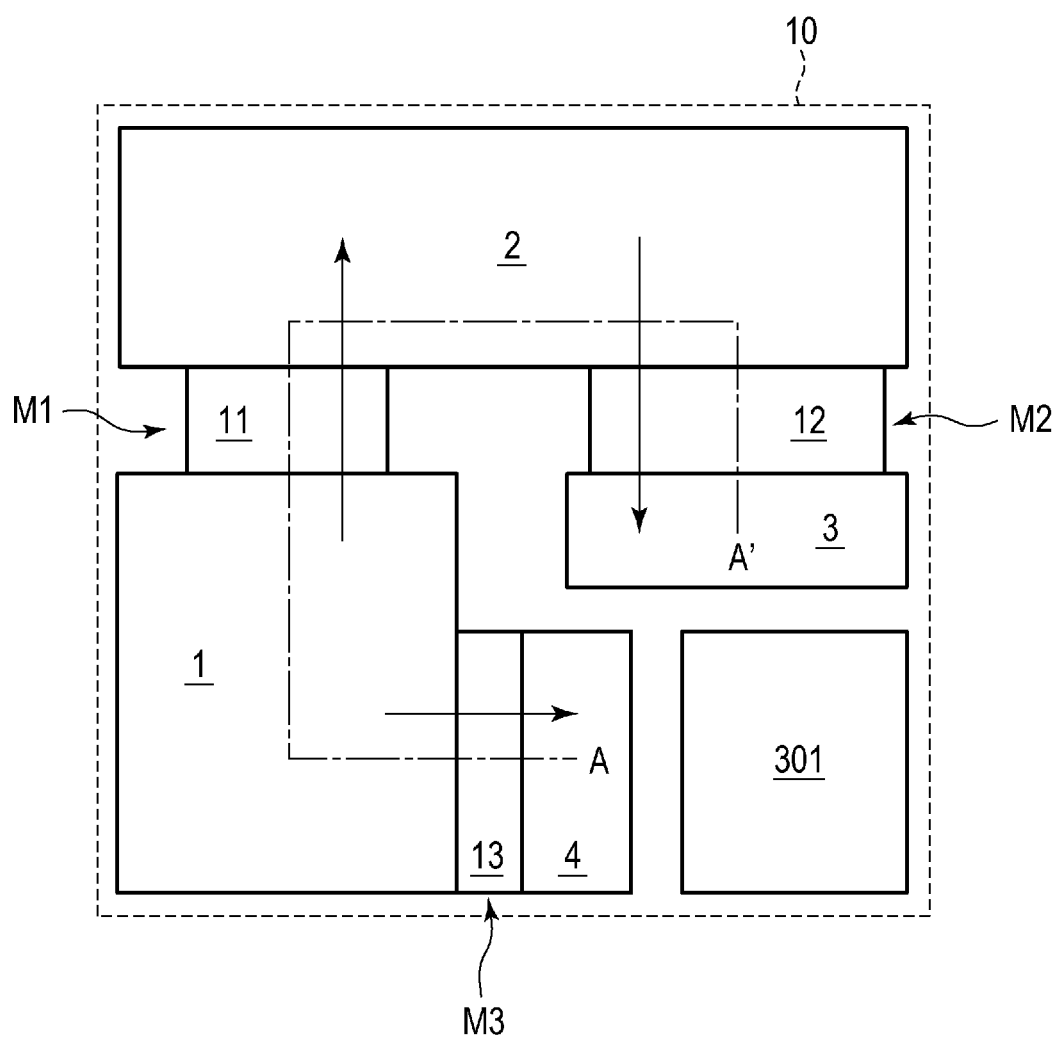
FIG. 3 is a plan view of a pixel of the first embodiment.

FIG. 3 is a plan view of the pixel 10 in the present embodiment and illustrates the arrangement of each element of the pixel 10. An element which is the same as that illustrated in FIG. 2 or corresponds thereto is labeled with the same reference symbol. Although each element is depicted as a rectangle region for simplified illustration, the shape of each element is not necessarily required to be a rectangle, and the size and arrangement of each element are also not limited to those depicted.

The photoelectric conversion portion 1 is arranged in a corner of the pixel 10, and the holding portion 2 is arranged facing the photoelectric conversion portion 1. A first transfer gate 11 of the first transfer transistor M1 is formed between the photoelectric conversion portion 1 and the holding portion 2. The charge draining portion 4 is arranged facing the photoelectric conversion portion 1, a third transfer gate 13 of the third transfer transistor M3 is formed between the photoelectric conversion portion 1 and the charge draining portion 4. The floating diffusion portion 3 is arranged on the same side of the photoelectric conversion portion 1 with respect to the holding portion 2, and a second transfer gate 12 of the second transfer transistor M2 is formed between the holding portion 2 and the floating diffusion portion 3. Note that, in the transfer gates 11, 12, and 13, the length in a direction parallel to the transfer direction is denoted as a gate length, and the length in a direction perpendicular to the transfer direction is denoted as a gate width. The reset transistor M4, the amplification transistor M5, the selection transistor M6, and the like are arranged in the pixel transistor region 301. The gate of the amplification transistor M5 and the source of the reset transistor M4 are connected to the floating diffusion portion 3.

The arrows of FIG. 3 indicate the transfer direction of charges when the first transfer transistor M1, the second transfer transistor M2, and the third transfer transistor M3 are driven. That is, once the first transfer transistor M1 is turned on, charges are transferred from the photoelectric conversion portion 1 to the holding portion 2, and when the second transfer transistor M2 is then turned on, the charges are transferred from the holding portion 2 to the floating diffusion portion 3. When the third transfer transistor M3 is turned on, charges are transferred from the photoelectric conversion portion 1 to the charge draining portion 4.

Figure 4A:
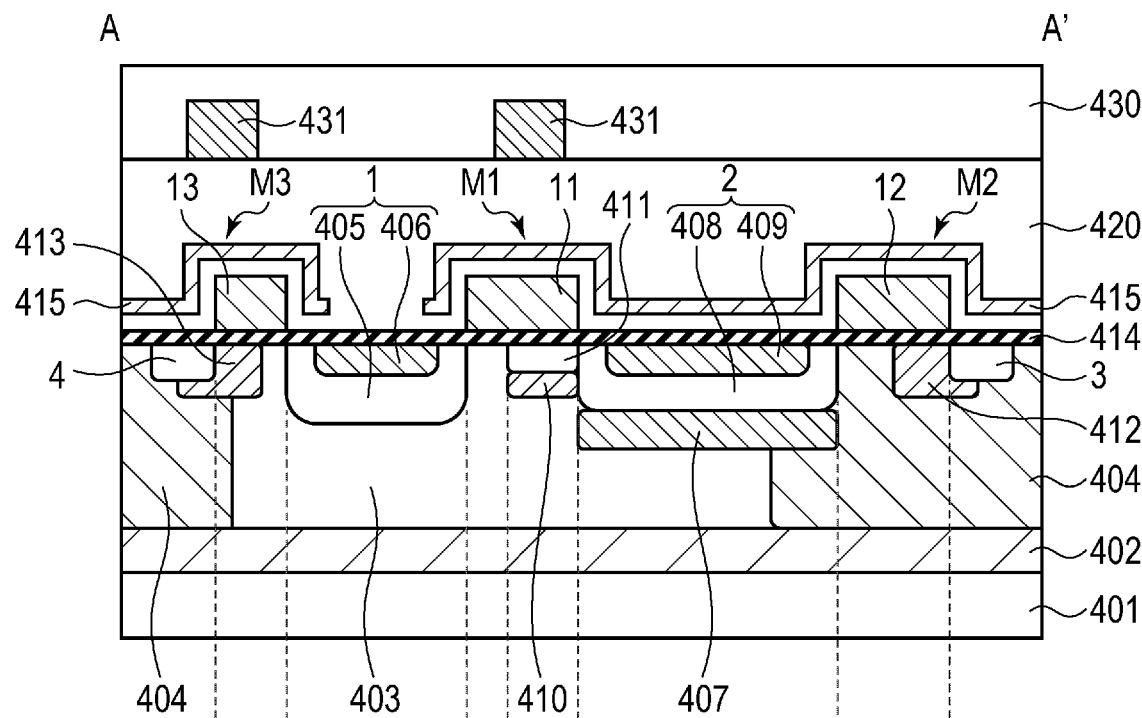
FIG. 4A is a sectional view of the pixel of the first embodiment.
Figure 4B:
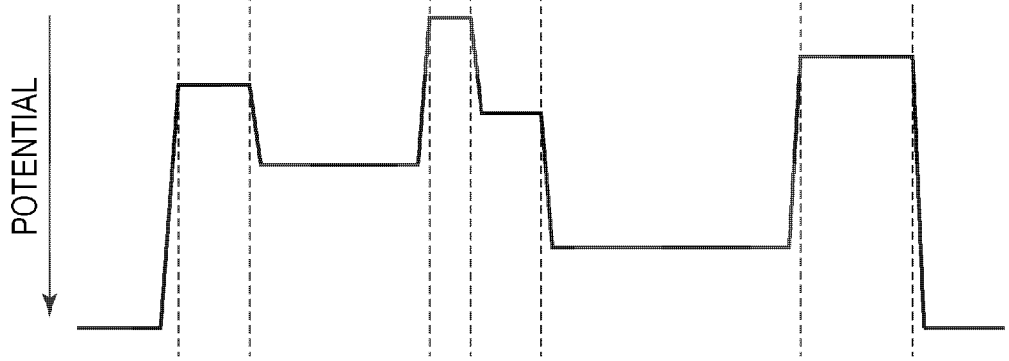
FIG. 4B is a diagram illustrating the potential of the pixel of the first embodiment.

FIG. 4A and FIG. 4B are a sectional view of the pixel 10 and a diagram illustrating the potential in the present embodiment. FIG. 4A depicts a cross section of the pixel 10 taken along A-A' of FIG. 3. FIG. 4B illustrates the potential distribution of each portion illustrated in FIG. 4A during charge accumulation. An element which is the same as or corresponds to the element illustrated in FIG. 2 and FIG. 3 is labeled with the same reference symbol. In the following description, while the first conductivity type is an N-type and the second conductivity type is a P-type, the N-type and the P-type may be opposite. Further, while description will be provided as a charge being an example of a carrier, a hole may be used as a carrier.

On a semiconductor substrate 401, a buried layer 402 of the second conductivity type, a well 403 of the first conductivity type, and a well 404 of the second conductivity type are formed. The photoelectric conversion portion 1 is formed of a first conductivity type region 405 and a surface passivation layer 406 of the second conductivity type. The holding portion 2 is formed of a buried layer 407 of the second conductivity type, a first conductivity type region 408, and a surface passivation layer 409 of the second conductivity type. The buried layer 407 also has an effect of suppressing charges generated in the well 403 of the first conductivity type from being accumulated in the holding portion 2. This can improve the light-shielding performance of the holding portion 2. The floating diffusion portion 3 and the charge draining portion 4 may be formed as regions of the first conductivity type in the well 404.

The first transfer transistor M1 is formed of the first transfer gate 11 on a gate insulating film 414 and the first conductivity type regions 405 and 408 shared by the source/drain region. A first charge barrier region 410 of the second conductivity type and a transfer assist region 411 of the first conductivity type are provided in at least a part under the first transfer gate 11, for example, a part on the holding portion 2 side. The first charge barrier region 410 may suppress a charge inflow to the holding portion 2 from the photoelectric conversion portion 1 when the first transfer transistor M1 is in an off-state. This allows more charges to be accumulated in the photoelectric conversion portion 1. The transfer assist region 411 can facilitate a flow of charges from the photoelectric conversion portion 1 to the holding portion 2 when the first transfer transistor M1 is in an on-state. When the first transfer transistor M1 is in an on-state, most of charges, which are carriers, are collected in the transfer assist region 411. Next, in response to the first transfer transistor M1 being in an off-state, charges move to the holding portion 2 or the photoelectric conversion portion 1. In a channel under the first transfer gate 11, due to the presence of the transfer assist region 411, a potential slope that causes charges to be directed from the photoelectric conversion portion 1 to the holding portion 2 is formed. Thus, charges do not move to the photoelectric conversion portion 1 but moves to the holding portion 2. In this way, the transfer assist region 411 can suppress a reverse flow of charges to the photoelectric conversion portion 1 and improve the transfer characteristic.

The second transfer transistor M2 is formed of the second transfer gate 12 on the gate insulating film 414 and the first conductivity type region 418 and the floating diffusion portion 3 shared by the source/drain region. A second charge barrier region 412 of the second conductivity type is provided in at least a part under the second transfer gate 12, for example, on the floating diffusion portion 3 side. The second charge barrier region 412 suppresses a charge inflow to the floating diffusion portion 3 from the holding portion 2 when the second transfer transistor M2 is in an off-state. This allows more charges to be accumulated in the holding portion 2.

The third transfer transistor M3 is formed of the third transfer gate 13 on the gate insulating film 414 and the first conductivity type region 405 and the charge draining portion 4 shared by the source/drain region. A third charge barrier region 413 of the second conductivity type is provided in at least a part under the third transfer gate 13, for example, on the charge draining portion 4 side. The third charge barrier region 413 suppresses a charge inflow to the charge draining portion 4 from the photoelectric conversion portion 1 when the third transfer transistor M3 is in an off-state. This allows more charges to be accumulated in the photoelectric conversion portion 1.

The light-shielding film 415 is formed so as to cover the semiconductor substrate 401, the first transfer gate 11, the second transfer gate 12, and the third transfer gate 13. In this case, the light-shielding film 415 is opened on the photoelectric conversion portion 1 and a region where a contact plug is provided. An interlayer insulating film 420 is formed on the light-shielding film 415, and a wiring 431 and an interlayer insulating film 430 are further formed on the interlayer insulating film 420.

In the present embodiment, in comparison of the impurity concentrations of the second conductivity type under the first to third transfer gates 11 to 13, the impurity concentration under the first transfer gate 11 is the lowest. That is, the second conductivity type impurity concentration under the first transfer gate 11 is lower than the second conductivity type impurity concentrations under the second transfer gate 12 and the third transfer gate 13. This is because the transfer assist region 411 is present under the first transfer gate 11. On the other hand, the present embodiment is configured such that the potential barrier under the transfer gate 11 can be the highest in the transfer gates 11, 12, and 13 when the photoelectric conversion portion 1 is accumulating charges. Thereby, excessive charges which cannot be accumulated by the photoelectric conversion portion 1 are drained to the charge draining portion 4 without flowing into the holding portion 2. Further, excessive charges which cannot be accumulated by the holding portion 2 flow into the floating diffusion portion 3 without flowing into the photoelectric conversion portion 1. In this state, by resetting the floating diffusion portion 3 immediately before reading out a signal, excessive charges can be drained.

In order to reduce the potential barrier of the third transfer gate 13, the following methods may be employed, for example. A first method is to increase the gate width of the third transfer gate 13. A wider gate width results in a weaker narrow channel effect, and thereby the potential barrier in an off-state decreases. A second method is to reduce the gate length of the third transfer gate 13. A shorter gate length results in a decreased potential barrier in an off-state due to a short channel effect. It is preferable that the gate width of the third transfer gate 13 be wider than the gate width of the first transfer gate 11. Furthermore, it is preferable that the gate width of the third transfer gate 13 be shorter than the gate width of the first transfer gate 11. Since the transfer assist region 411 is formed under the first transfer gate 11, the potential barrier of the first transfer gate 11 is low. Thus, in order to further reduce the potential barrier of the third transfer gate 13 to be lower than the first transfer gate 11, it is preferable to form a wider or shorter channel. A third method is to adjust an off-voltage to be applied to the third transfer gate 13 during charge accumulation. That is, the potential barrier of the third transfer gate 13 may be reduced by increasing the low-level voltage of the drive pulse pOFG of the third transfer gate 13 to be higher than the low-level voltage of the drive pulse pGS of the first transfer gate 11. The low-level voltages of the drive pulses pOFG, pTX, and pGS can be changed by the power source supply unit 104. Any of the above-described first to third methods may be employed, or two or more of the methods may be combined.

In a similar manner, also in the second transfer gate 12, the potential barrier can be reduced by using any of the above-described first to third methods. That is, the gate width of the second transfer gate 12 may be increased, or the gate length thereof may be reduced. Furthermore, the potential barrier may be reduced by increasing the off-voltage of the drive pulse pTX to be applied to the second transfer gate 12 during charge accumulation. With the above configuration, the potential distribution illustrated in FIG. 4B is realized. During charge accumulation, that is, when all of the first transfer transistor M1, the second transfer transistor M2, and the third transfer transistor M3 are in an off-state, the potential barrier of the first transfer gate 11 may be higher than the potential barriers of the second transfer gate 12 and the third transfer gate 13.

According to the present embodiment, when the first transfer transistor M1 and the third transfer transistor M3 are in an off-state, such a state may be obtained that the potential barrier of the first transfer gate 11 is higher than the potential barrier of the third transfer gate 13. Therefore, when the photoelectric conversion portion 1 is saturated with charges, it is possible to prevent charges from leaking from the photoelectric conversion portion 1 to the holding portion 2 and thus obtain a good image quality. Further, when the first transfer transistor M1 and the second transfer transistor M2 are in an off-state, such a state may be obtained that the potential barrier of the first transfer gate 11 is higher than the potential barrier of the second transfer gate 12. Therefore, excessive charges which cannot be accumulated in the holding portion 2 flow into the floating diffusion portion 3 without flowing into the photoelectric conversion portion 1. In this state, by resetting the floating diffusion portion 3 immediately before reading out a signal, excessive charges can be drained, and thereby a good image quality can be obtained. Note that, in the above-described prior art reference (International Publication No. WO2011/043432), if the off-state potential barrier of the entire channel under the first transfer gate is increased for preventing a reverse flow of charges, full transfer of charges cannot be made. In contrast, according to the present embodiment, the first to third transfer gates are configured such that the second conductivity type impurity concentration of the first transfer gate 11 is the lowest while the off-state potential barrier of the entire channel under the first transfer gate 11 is increased. It is therefore possible to realize full transfer of charges while preventing leakage of charges and thus obtain a good image quality in the global shutter. Therefore, a problem such as a residual image can be avoided among a plurality of frames of a motion image.

Next, respective processes of a manufacturing method of the solid state imaging device according to the present embodiment will be described sequentially by using FIG. 5A to FIG. 9B.

Figure 5A:
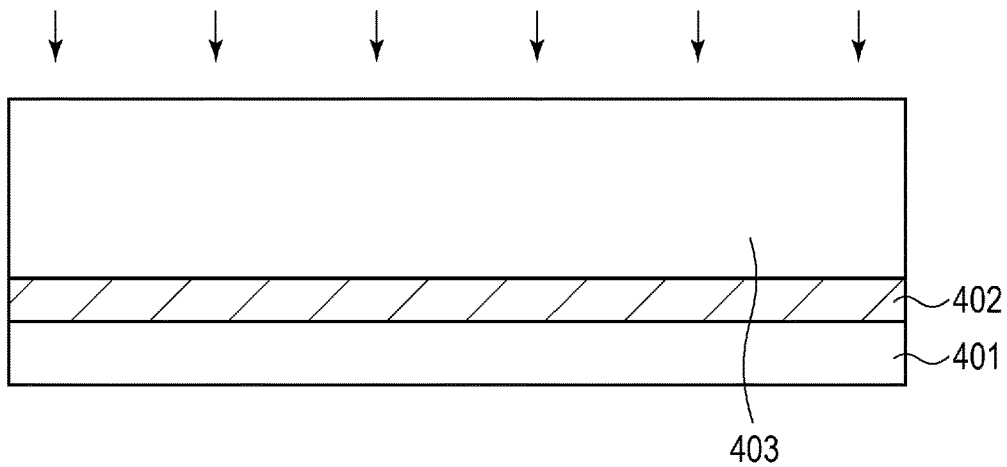
FIG. 5A, FIG. 5B, and FIG. 5C are diagrams illustrating a manufacturing method of the solid state imaging device according to the first embodiment.

In FIG. 5A, first, the semiconductor substrate 401 of the first conductivity type is prepared. A photoresist film is applied on the semiconductor substrate 401, and a photolithography process is performed to form a pattern of the photoresist film so as to open a pixel region. Ions of the second conductivity type are implanted using the photoresist film as a mask. Furthermore, ions of the first conductivity type may be implanted into a region that is shallower than the region into which ions of the second conductivity type are implanted. Then, the photoresist film is removed, and activation anneal is performed to form the buried layer 402 of the second conductivity type and the well 403 of the first conductivity type.

Figure 5B:
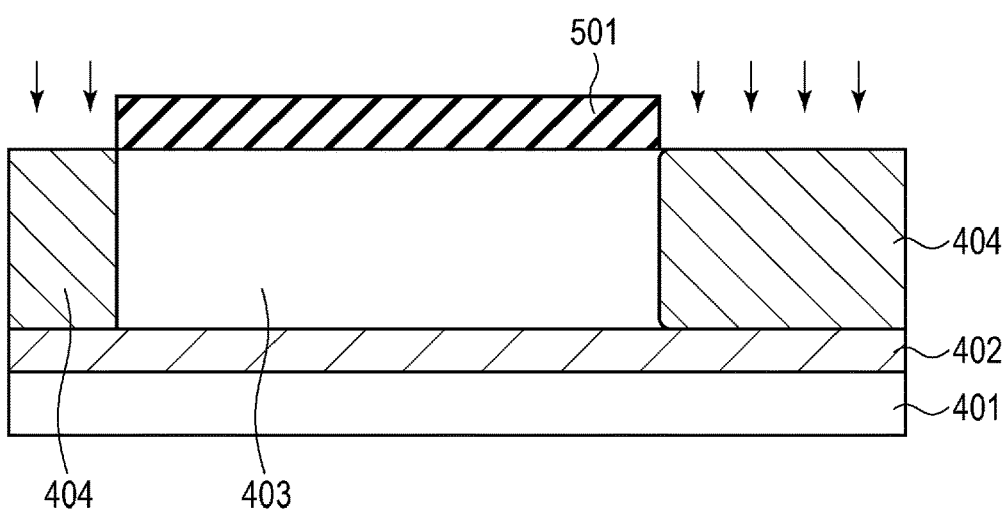

In FIG. 5B, a photoresist film 501 is applied, and a photolithography process is performed to form a pattern of the photoresist film 501 so as to open the floating diffusion portion 3, the charge draining portion 4, and a part of the holding portion 2. Ions of the second conductivity type are implanted using the photoresist film 501 as a mask. Then, the photoresist film 501 is removed, and activation anneal is performed to form well 404 of the second conductivity type.

Figure 5C:
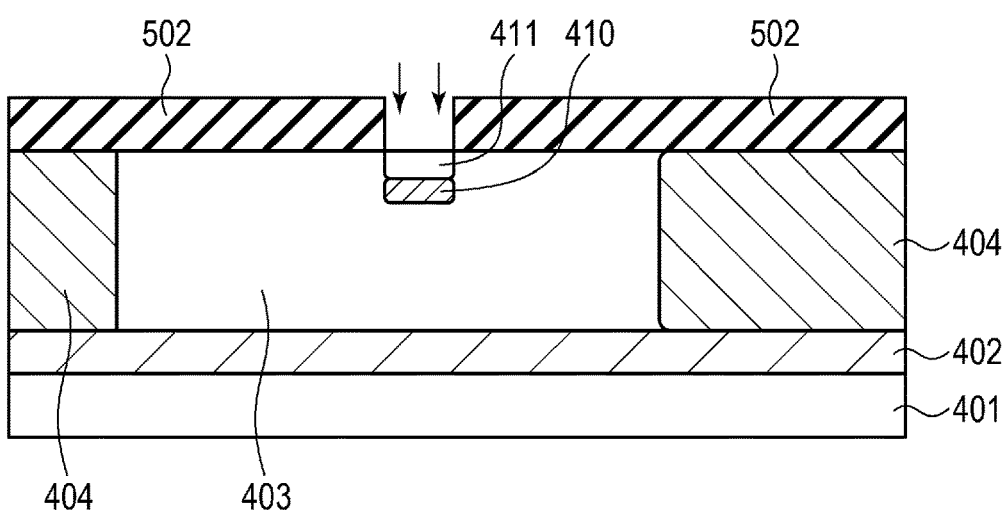

In FIG. 5C, a photoresist film 502 is applied, and a photolithography process is performed to form a pattern of the photoresist film 502 so as to open (expose) at least a part under the first transfer gate 11. Doping is performed by implanting ions of the second conductivity type using the photoresist film 502 as a mask. Furthermore, ions of the first conductivity type are implanted into a region shallower than the depth of the previously described ion implantation. This allows a difference in the potential to be provided under the channel when the first transfer transistor M1 is in an on-state, which can realize a good transfer characteristic. The photoresist film 502 is removed, and activation anneal is performed to form the first charge barrier region 410 of the second conductivity type and the transfer assist region 411 of the first conductivity type. Although the same mask is used for the formation of the first charge barrier region 410 and the formation of the transfer assist region 411 in this example, different masks having different opening positions may be used.

Figure 6A:
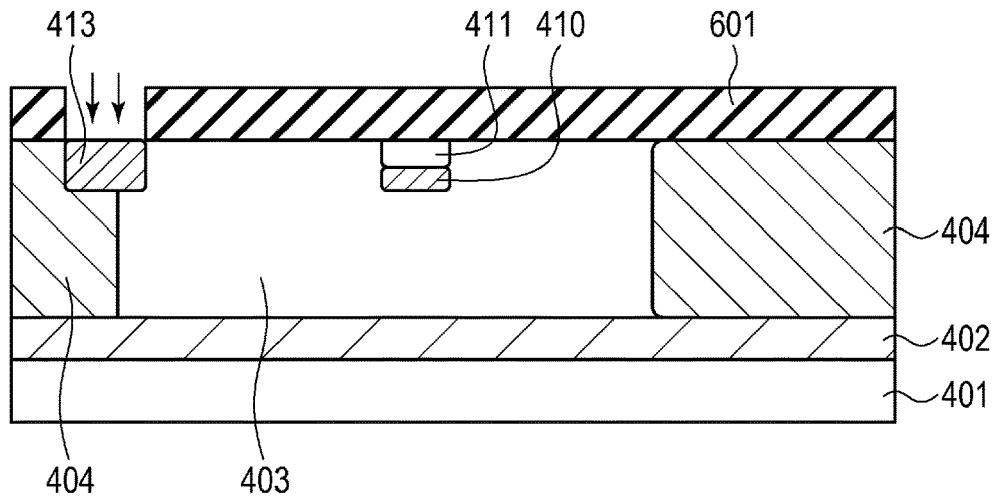
FIG. 6A, FIG. 6B, and FIG. 6C are diagrams illustrating the manufacturing method of the solid state imaging device according to the first embodiment.

In FIG. 6A, a photoresist film 601 is applied, and a photolithography process is performed to form a pattern of the photoresist film 601 so as to open at least a part under the third transfer gate 13. Ions of the second conductivity type are implanted using the photoresist film 601 as a mask. The photoresist film 601 is removed, and activation anneal is performed to form the third charge barrier region 413 of the second conductivity type.

Figure 6B:
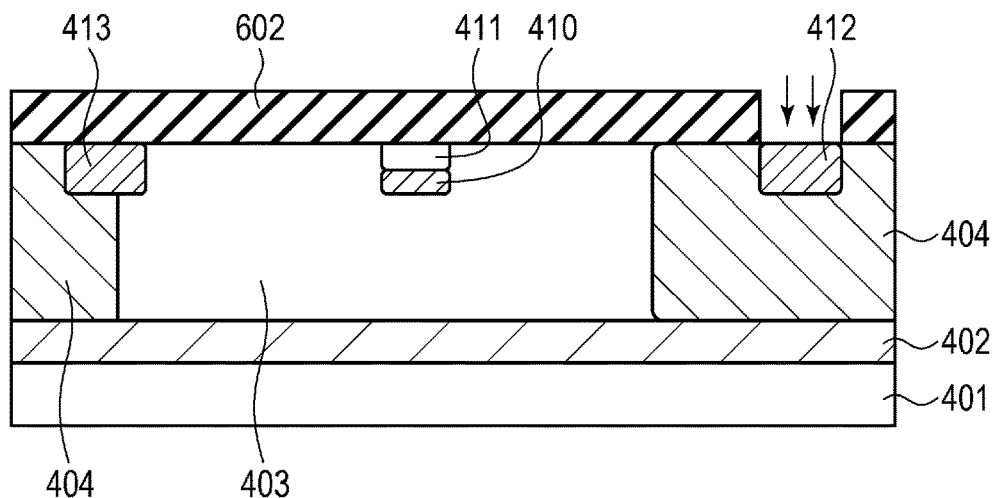

In FIG. 6B, a photoresist film 602 is applied, and a photolithography process is performed to form a pattern of the photoresist film 602 so as to open at least a part under the second transfer gate 12. Ions of the second conductivity type are implanted using the photoresist film 602 as a mask. The photoresist film 602 is removed, and activation anneal is performed to form the second charge barrier region 412 of the second conductivity type.

Although the different masks are used for the formation of the second charge barrier region 412 and the formation of the third charge barrier region 413 in this example, the same mask may be used. Thereby, the number of masks can be reduced. Further, by using a different mask from that used in the formation of the first charge barrier region 410, the impurity concentration of the second conductivity type under the first transfer gate 11 can be lower than the respective impurity concentrations of the second conductivity type in a region under the second transfer gate 12 and a region under the third transfer gate 13.

Figure 6C:
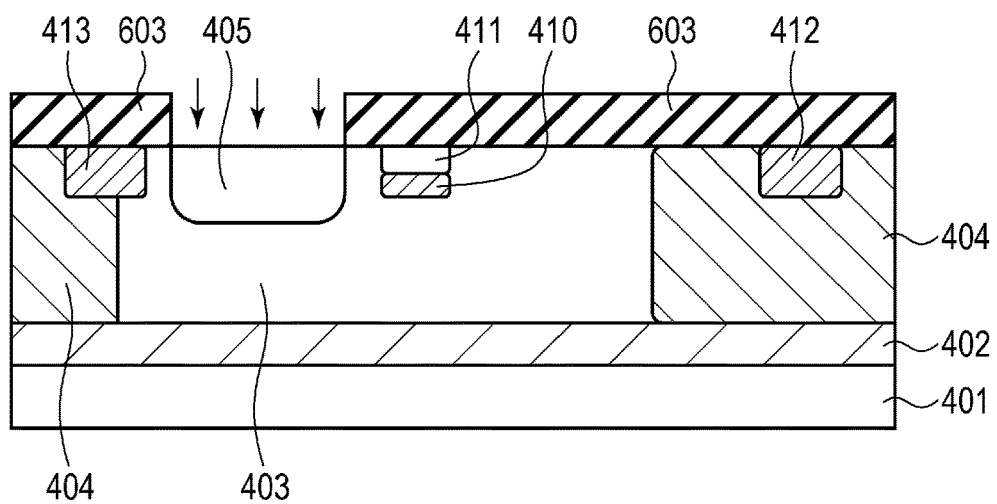

In FIG. 6C, a photoresist film 603 is applied, and a photolithography process is performed to form a pattern of the photoresist film 603 so as to open the photoelectric conversion portion 1. Ions of the first conductivity type are then implanted using the photoresist film 603 as a mask. Then, the photoresist film 603 is removed, and activation anneal is performed to form the first conductivity type region 405 of the photoelectric conversion portion 1.

Figure 7A:
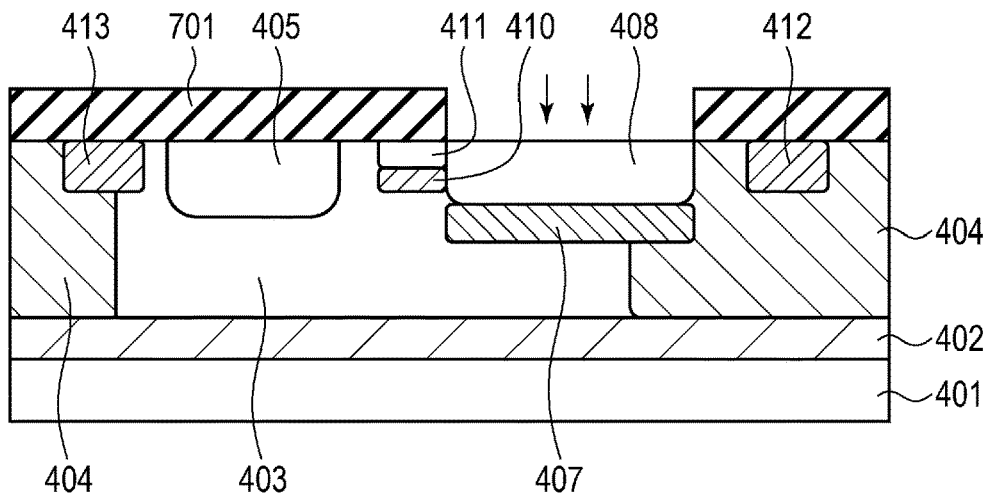
FIG. 7A, FIG. 7B, and FIG. 7C are diagrams illustrating the manufacturing method of the solid state imaging device according to the first embodiment.

In FIG. 7A, a photoresist film 701 is applied, and a photolithography process is performed to form a pattern of the photoresist film 701 so as to open the holding portion 2. Ions of the second conductivity type are then implanted using the photoresist film 701 as a mask. Furthermore, ions of the first conductivity type are implanted into a region shallower than that in the previously described ion implantation. Then, the photoresist film 701 is removed, and activation anneal is performed to form the buried layer 407 of the second conductivity type under the holding portion 2 and the first conductivity type region 408.

Figure 7B:
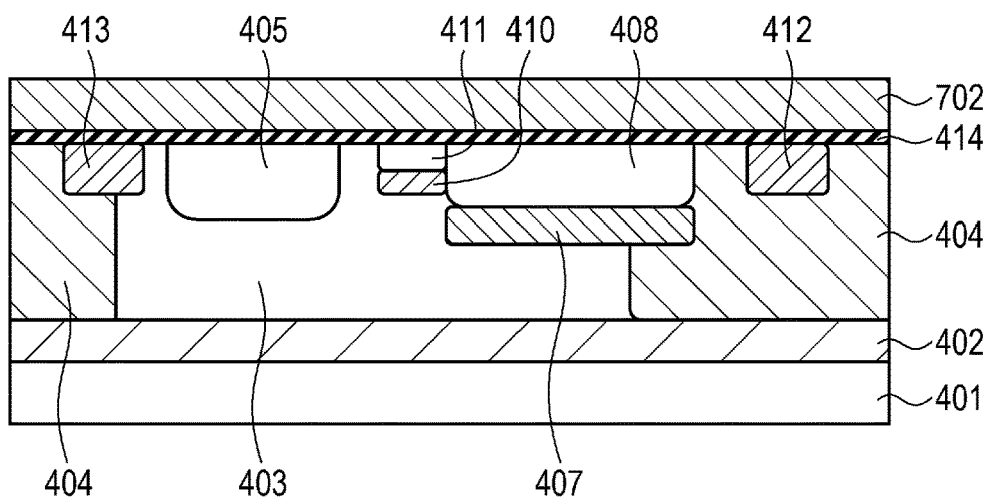
Figure 7C:
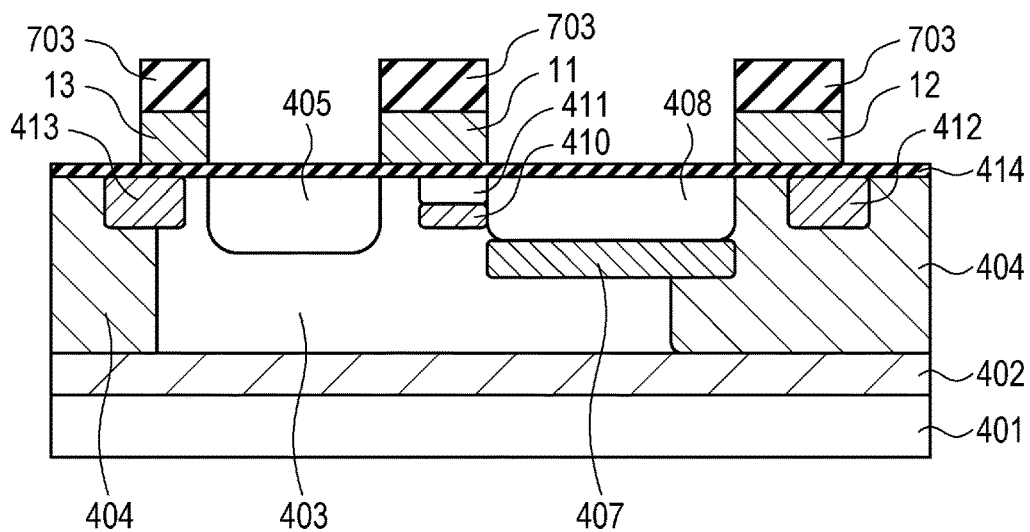

In FIG. 7B, after the surface of the semiconductor substrate 401 is thermally oxidized and the gate insulating film 414 made of $SiO_2$ is formed, a polysilicon film 702 is deposited on the gate insulating film 414. The photoresist film 703 is then applied onto the polysilicon film 702 to perform a photolithography process. As illustrated in FIG. 7C, a pattern of the photoresist film 703 is formed. The first transfer gate 11 is arranged between the photoelectric conversion portion 1 and the holding portion 2, and the second transfer gate 12 is arranged between the holding portion 2 and the floating diffusion portion 3. Further, the third transfer gate 13 is arranged between the photoelectric conversion portion 1 and the charge draining portion 4. The polysilicon film 702 is etched using the photoresist film 703 as a mask. Then, the photoresist film 703 is removed, and the first transfer gate 11, the second transfer gate 12, and the third transfer gate 13 are formed.

In this example, in the first transfer gate 11, the second transfer gate 12, and the third transfer gate 13, it is preferable that the third transfer gate 13 have the widest gate width, that is, the width in a direction perpendicular to the sheet. Further, in the first transfer gate 11, the second transfer gate 12, and the third transfer gate 13, it is preferable that the third transfer gate 13 have the shortest length in a direction from the photoelectric conversion portion 1 to the holding portion 2, that is, the gate length. This causes excessive charges which cannot be accumulated in the photoelectric conversion portion 1 to be drained to the charge draining portion 4 without flowing into the holding portion 2.

In FIG. 8A, a photoresist film 801 is applied, and a photolithography process is performed to form a pattern of the photoresist film 801 so as to open the floating diffusion portion 3 and the charge draining portion 4. As illustrated in FIG. 8A, ions of the first conductivity type are then implanted using the photoresist film 801 as a mask. Then, the photoresist film 801 is removed, and activation anneal is performed to form the floating diffusion portion 3 and the charge draining portion 4.

In FIG. 8B, a photoresist film 802 is applied, and a photolithography process is performed to form a pattern of the photoresist film 802 so as to open a part of the first transfer gate 11, a part of the third transfer gate 13, and the photoelectric conversion portion 1. Ions of the second conductivity type are then implanted using the photoresist film 802 and the first transfer gate 11 as masks. Then, the photoresist film 802 is removed, and activation anneal is performed to form the surface passivation layer 406 of the photoelectric conversion portion 1.

In FIG. 8C, a photoresist film 803 is applied, and a photolithography process is performed to form a pattern of the photoresist film 803 so as to open a part of the first transfer gate 11, a part of the second transfer gate 12, and the holding portion 2. Ions of the second conductivity type are then implanted using the photoresist film 803, the first transfer gate 11, and the second transfer gate 12 as masks. Then, the photoresist film 803 is removed, and activation anneal is performed to form the surface passivation layer 409 of the holding portion 2.

Figure 9A:
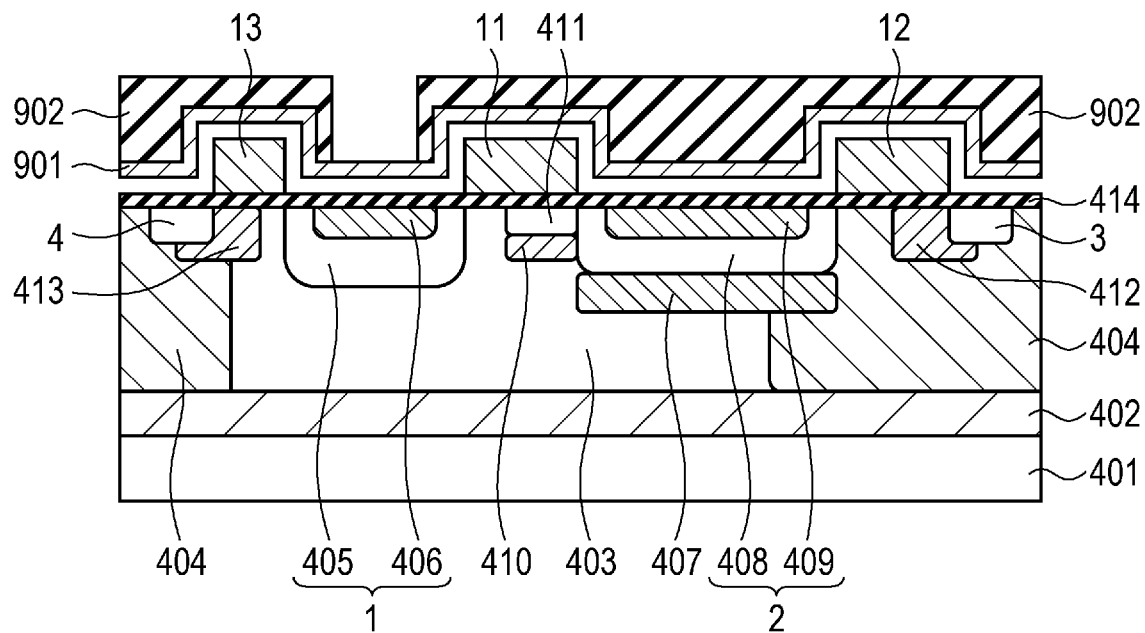
FIG. 9A and FIG. 9B are diagrams illustrating the manufacturing method of the solid state imaging device according to the first embodiment.

In FIG. 9A, a light-shielding film 901 is formed in the pixel region. A photoresist film 902 is applied onto the light-shielding film 901, and a photolithography process is performed to form a pattern of the photoresist film 902 so as to open respective regions above the photoelectric conversion portion 1 and the contact plug. The light-shielding film 901 is then etched using the photoresist film 902 as a mask. Then, the photoresist film 902 is removed to form the light-shielding film 415 having respective openings above the photoelectric conversion portion 1 and the contact plug.

Figure 9B:
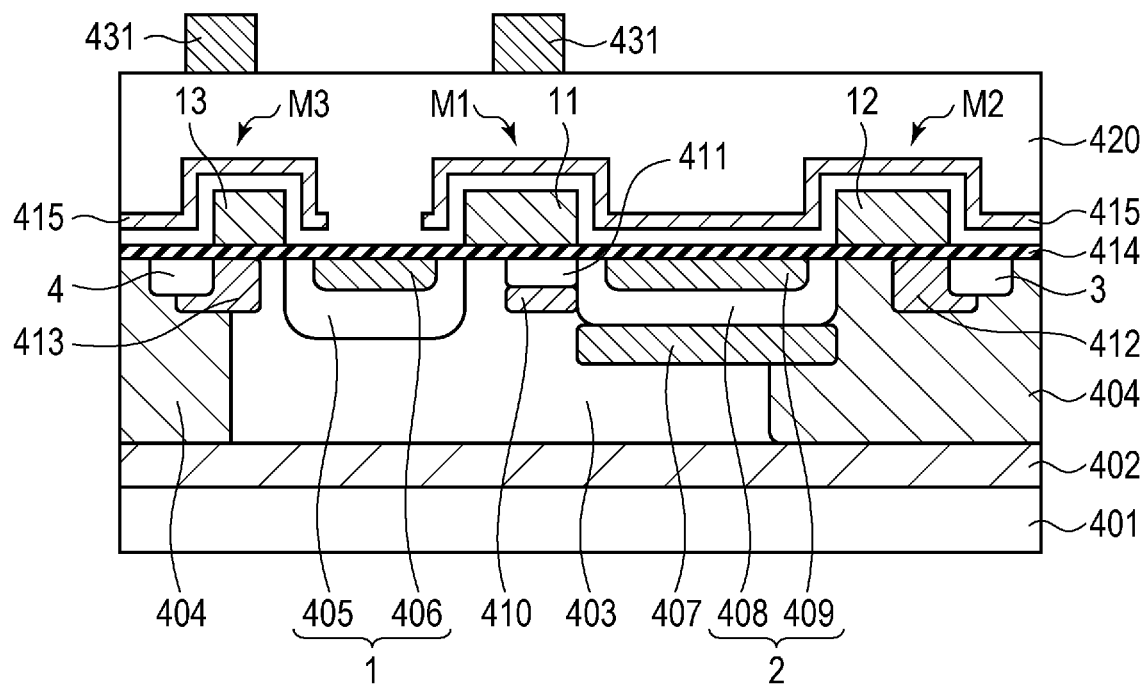

In FIG. 9B, the interlayer insulating film 420 is formed, and the wiring 431 is formed on the interlayer insulating film 420. Furthermore, a micro lens (not shown) is formed over the photoelectric conversion portion 1, and thereby the solid state imaging device according to the present embodiment is completed.

As described above, according to the present embodiment, it is possible to prevent leakage of charges when transfer gates are in an off-state while realizing full transfer of charges. That is, in a solid state imaging device having a global shutter function, a good image quality can be obtained.

Second Embodiment

Figure 10:
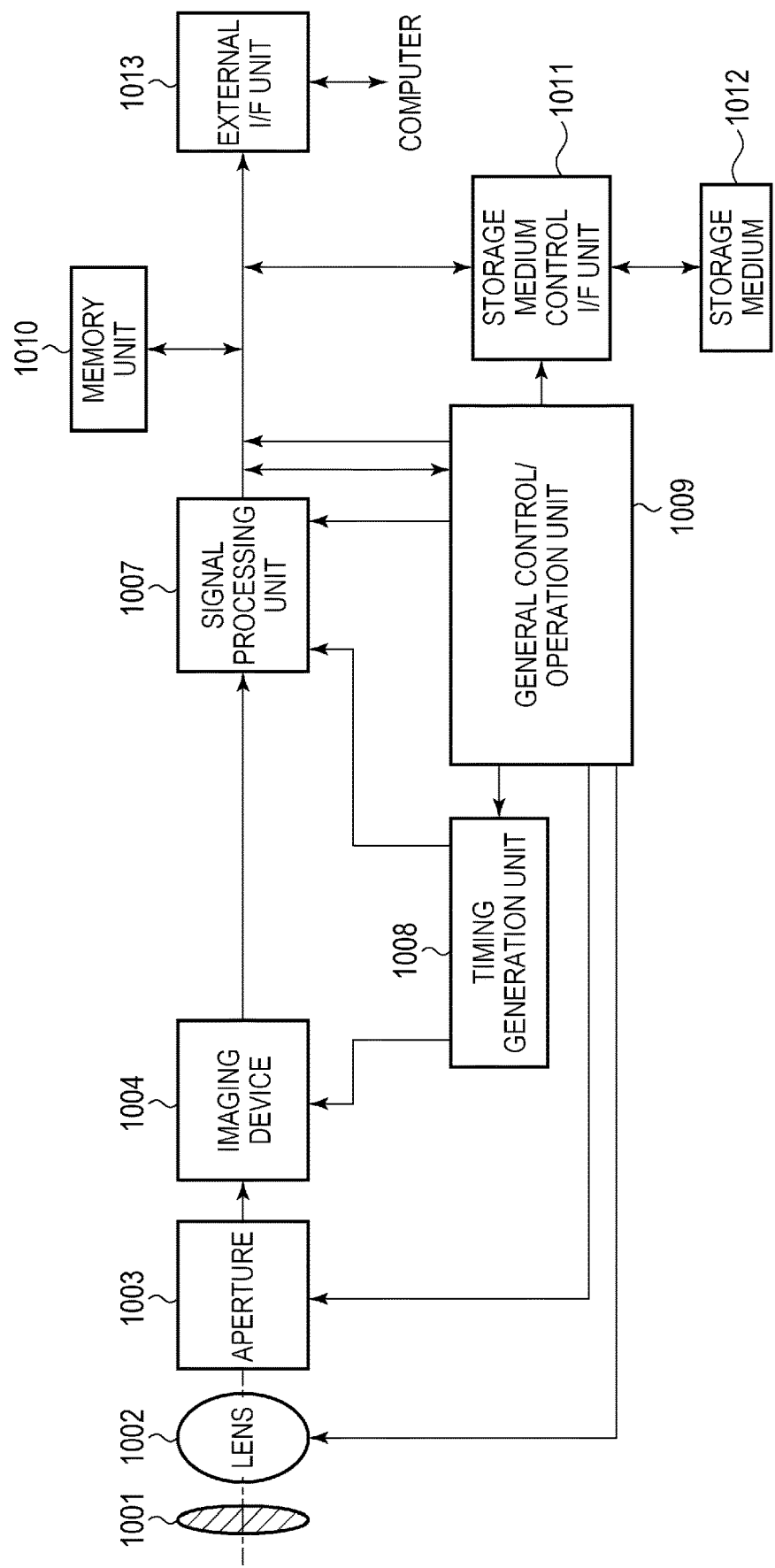
FIG. 10 is a block diagram of an imaging system according to a second embodiment.

The solid state imaging device according to the above-described embodiment can be applied to various imaging systems. The imaging system may be a digital still camera, a digital camcorder, a camera head, a copier machine, a fax machine, a mobile phone, an on-vehicle camera, an observation satellite, a surveillance camera, or the like. FIG. 10 illustrates a block diagram of a digital still camera as an example of the imaging system.

The imaging system illustrated in FIG. 10 includes a barrier 1001, a lens 1002, an aperture 1003, an imaging device 1004, a signal processing unit 1007, a timing generation unit 1008, a general control/operation unit 1009, a memory unit 1010, storage medium control I/F unit 1011, a storage medium 1012, and an external I/F unit 1013. The barrier 1001 protects the lens 1002, and the lens 1002 captures an optical image of a subject onto the imaging device 1004. The aperture 1003 changes the amount of a light that has passed through the lens 1002. The imaging device 1004 includes the solid state imaging device of the above-described embodiment and converts an optical image captured by the lens 1002 into image data. In this example, an AD conversion unit is formed on the semiconductor substrate of the imaging device 1004. The signal processing unit 1007 performs various correction or data compression on the captured data output from the imaging device 1004. The timing generation unit 1008 outputs various timing signals to the imaging device 1004 and the signal processing unit 1007. The general control/operation unit 1009 controls the entire digital still camera, and the memory unit 1010 temporarily stores image data. The storage medium control I/F unit 1011 is an interface for recording or reading out image data to or from the storage medium 1012, and the storage medium 1012 is a removable storage medium such as a semiconductor memory for recording or reading out captured data. The external I/F unit 1013 is an interface for communicating with an external computer or the like. A timing signal or the like may be input from the outside of the imaging system, and the imaging system may have at least the imaging device 1004 and the signal processing unit 1007 that processes a captured signal output from the imaging device 1004.

In the present embodiment, the configuration in which the imaging device 1004 and the AD conversion unit are provided on separate semiconductor substrates has been described. However, the imaging device 1004 and the AD conversion unit may be formed on the same semiconductor substrate. Further, the imaging device 1004 and the signal processing unit 1007 may be formed on the same semiconductor substrate.

Further, each of the pixels may include a first photoelectric conversion portion and a second photoelectric conversion portion. The signal processing unit 1007 may be configured to process a pixel signal based on charges generated in the first photoelectric conversion portion and a pixel signal based on charges generated in the second photoelectric conversion portion to acquire distance information on the distance from the imaging device 1004 to a subject.

Third Embodiment

Figure 11A:
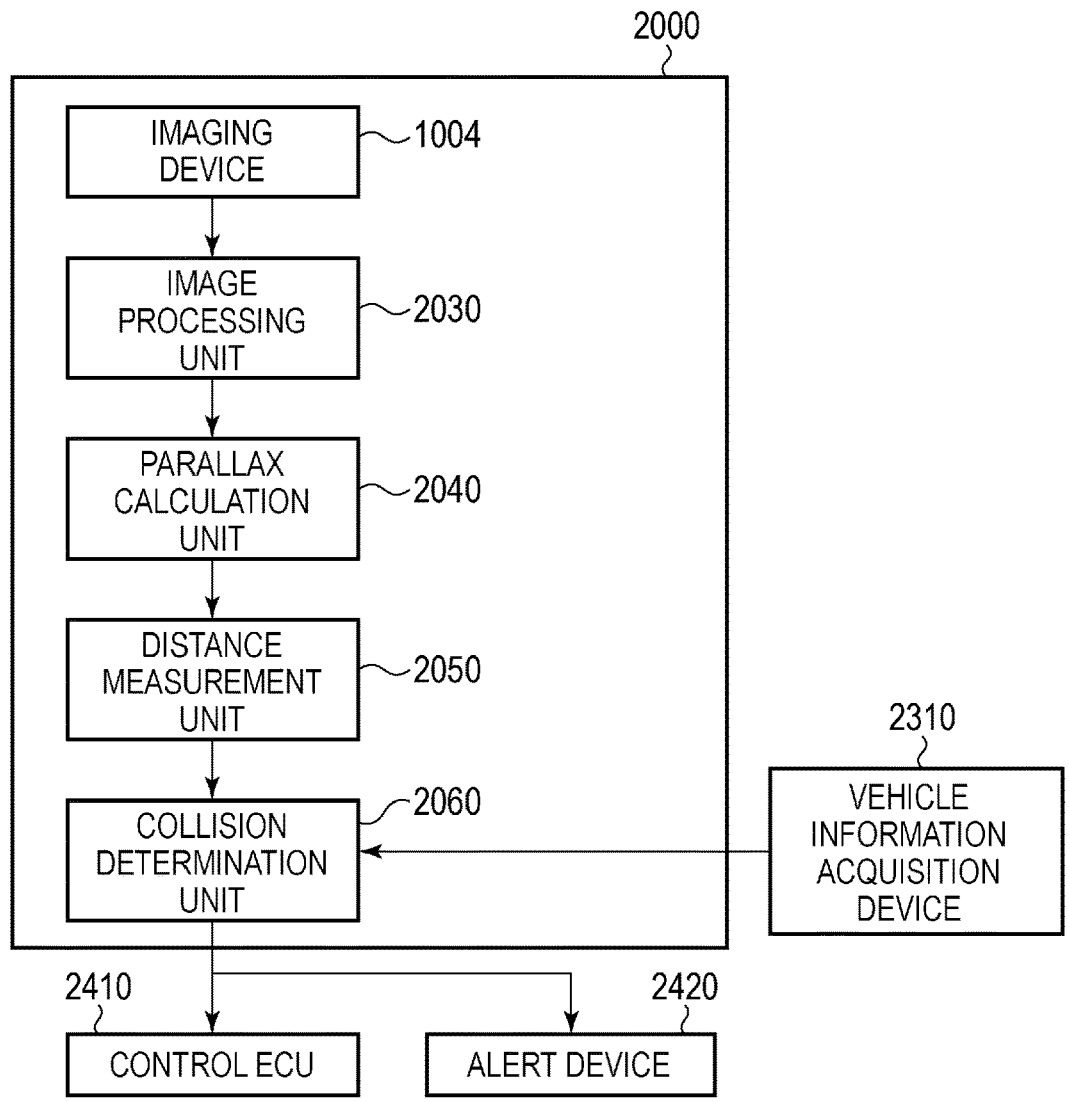
FIG. 11A and FIG. 11B are block diagrams of the imaging system according to a third embodiment.
Figure 11B:
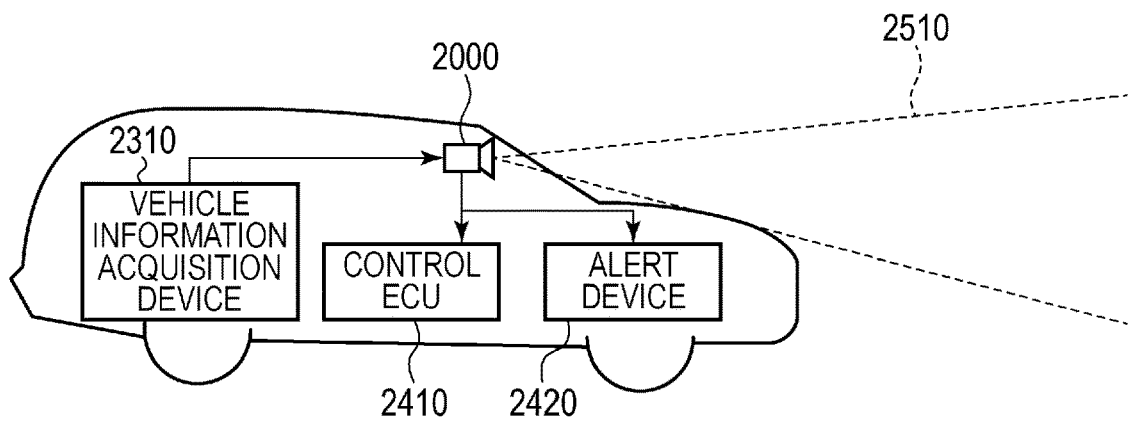

FIG. 11A and FIG. 11B illustrate an example of the imaging system with respect to an on-vehicle camera in a third embodiment of the present invention. The imaging system 2000 has the imaging device 1004 of the above-described embodiment. The imaging system 2000 has an image processing unit 2030 that performs image processing on a plurality of image data acquired by the imaging device 1004 and a parallax calculation unit 2040 that calculates a parallax (a phase difference of parallax images) from the plurality of image data acquired by the imaging system 2000. Further, the imaging system 2000 has a distance measurement unit 2050 that calculates a distance to the object based on the calculated parallax and a collision determination unit 2060 that determines whether or not there is a collision possibility based on the calculated distance. Here, the parallax calculation unit 2040 and the distance measurement unit 2050 are an example of a distance information acquisition unit that acquires distance information on the distance to the object. That is, the distance information is information on a parallax, a defocus amount, a distance to an object, or the like. The collision determination unit 2060 may use any of the distance information to determine the collision possibility. The distance information acquisition unit may be implemented by dedicatedly designed hardware or may be implemented by a software module. Further, the distance information acquisition unit may be implemented by a field programmable gate array (FPGA) or an application specific integrated circuit (ASIC) or may be implemented by combination thereof.

The imaging system 2000 is connected to the vehicle information acquisition device 2310 and can acquire vehicle information such as a vehicle speed, a yaw rate, a steering angle, or the like. Further, the imaging system 2000 is connected with a control ECU 2410, which is a control device that outputs a control signal for causing a vehicle to generate braking force based on a determination result by the collision determination unit 2060. Further, the imaging system 2000 is connected with an alert device 2420 that issues an alert to the driver based on a determination result by the collision determination unit 2060. For example, when the collision probability is high as the determination result of the collision determination unit 2060, the control ECU 2410 as a moving unit control unit performs vehicle control to avoid a collision or reduce damage by applying a brake, pushing back an accelerator, suppressing engine power, or the like. The alert device 2420 alerts a user by sounding an alert such as a sound, displaying alert information on a display of a car navigation system or the like, providing vibration to a seat belt or a steering wheel, or the like. The imaging system 2000 functions as a control unit adapted to control operations for controlling a vehicle as described above.

In the present embodiment, an area around a vehicle, for example, a front area or a rear area is captured by using the imaging system 2000. FIG. 11B illustrates the imaging system in a case of capturing a front area of a vehicle (a capturing area 2510). The vehicle information acquisition device 2310 as a capturing control unit transmits instructions to the imaging system 2000 or the imaging device 1004 to perform the operation described in the above first or second embodiment. Since the operation of the imaging device 1004 is the same as that in the first or second embodiment, the description thereof will be omitted here. Such a configuration can further improve the ranging accuracy.

Although the example of control for avoiding a collision to another vehicle has been illustrated in the above description, the embodiment is applicable to automatic driving control for following another vehicle, automatic driving control for not going out of a traffic lane, or the like. Furthermore, the imaging system is not limited to a vehicle such as the subject vehicle, and can be applied to a moving unit (moving apparatus) such as a ship, an airplane, or an industrial robot, for example. In addition, the imaging system can be widely applied to any device which utilizes object recognition, such as an intelligent transportation system (ITS), without being limited to moving units.

Other Embodiments

The present invention is not limited to the above-described embodiments, but various modifications are possible. For example, an example in which a part of the configuration of any of the embodiments is added to another embodiment or an example in which a part of the configuration of any of the embodiments is replaced with a part of the configuration of another embodiment may also be one embodiment of the present invention.

While the above embodiments have been described for the case where the transistors of the pixel 10 are formed of N-type transistors, the transistors of the pixel 10 may be formed of P-type transistors. In this case, the level of each drive signal described above will be opposite. Further, the circuit configuration of the pixel 10 is not limited to that illustrated in FIG. 2, but may be changed as appropriate. For example, the pixel 10 may have the dual pixel structure having two photoelectric conversion portions in one pixel.

Note that all the above-described embodiments merely illustrate embodied examples in implementing the present invention, and the technical scope of the present invention should not be construed in a limiting sense by these examples. That is, the present invention can be implemented in various forms without departing from its technical idea or its primary feature.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-011970, filed Jan. 26, 2017, which is hereby incorporated by reference herein in its entirety.

What is claimed is:

1. A solid state imaging device comprising:
   a photoelectric conversion portion of a first conductivity type;
   a holding portion of the first conductivity type;
   a floating diffusion portion of the first conductivity type;
   a charge draining portion;
   a first transfer transistor that includes a first gate and transfers charges from the photoelectric conversion portion to the holding portion;
   a second transfer transistor that includes a second gate and transfers charges from the holding portion to the floating diffusion portion; and
   a third transfer transistor that includes a third gate and drains charges from the photoelectric conversion portion to the charge draining portion,
   wherein an impurity concentration of a second conductivity type in at least a part of a region under the first gate of the first transfer transistor is lower than an impurity concentration of the second conductivity type in a region under the second gate of the second transfer transistor and an impurity concentration of the second conductivity type in a region under the third gate of the third transfer transistor.

2. The solid state imaging device according to claim 1, wherein, when the first transfer transistor and the third transfer transistor are in an off-state, a potential barrier of the first transfer transistor is at least temporarily higher than a potential barrier of the third transfer transistor.

3. The solid state imaging device according to claim 1, wherein a gate width of the first gate of the first transfer transistor is less than a gate width of the third gate of the third transfer transistor.

4. The solid state imaging device according to claim 1, wherein a gate length of the first gate of the first transfer transistor is greater than a gate length of the third gate of the third transfer transistor.

5. The solid state imaging device according to claim 1, wherein, during accumulation of charges in the photoelectric conversion portion, a voltage applied to the first gate of the first transfer transistor is lower than a voltage applied to the third gate of the third transfer transistor.

6. The solid state imaging device according to claim 1, wherein a transfer assist region of the first conductivity type is formed in at least a part of the region under the first gate of the first transfer transistor.

7. The solid state imaging device according to claim 6, wherein the transfer assist region is formed in a portion on the holding portion side in the region under the first gate of the first transfer transistor.

8. The solid state imaging device according to claim 1, wherein a first charge barrier region of the second conductivity type is formed in at least a part of the region under the first gate of the first transfer transistor, a second charge barrier region of the second conductivity type is formed in at least a part of the region under the second gate of the second transfer transistor, and a third charge barrier region of the second conductivity type is formed in at least a part of the region under the third gate of the third transfer transistor.

9. The solid state imaging device according to claim 8, wherein the first charge barrier region is formed on the holding portion side under the first gate of the first transfer transistor, the second charge barrier region is formed on the floating diffusion portion side under the second gate of the second transfer transistor, and the third charge barrier region is formed on the charge draining portion side under the third gate of the third transfer transistor.

10. An imaging system comprising:
the solid state imaging device according to claim 1; and
a signal processing device that processes an image signal output from the solid state imaging device.

11. A moving unit comprising:
the solid state imaging device according to claim 1;
a distance information acquisition unit adapted to acquire distance information on a distance to an object, from a parallax image based on a signal output from the solid state imaging device; and
a moving unit control unit adapted to control the moving unit based on the distance information.

* * * * *